United States Patent [19]
Yokayama et al.

[11] Patent Number: 5,745,972
[45] Date of Patent: May 5, 1998

[54] METHOD OF PRODUCING PARTS/ SUBSTRATE ASSEMBLIES

[75] Inventors: Tetsuhiro Yokayama; Keiji Fujikawa; Yoouichi Fukuoka, all of Hadano; Yooichi Fujiwara, Zama; Junji Narita; Terumi Saitoo, both of Hadano; Hiroo Inoue, Isehara, all of Japan

[73] Assignees: Hitachi, Ltd., Tokyo; Hitachi Computer Engineering Co., Ltd., Hadano, both of Japan

[21] Appl. No.: 484,288

[22] Filed: Jun. 7, 1995

Related U.S. Application Data

[60] Division of Ser. No. 181,142, Jan. 12, 1994, Pat. No. 5,513,427, which is a continuation-in-part of Ser. No. 987,085, Dec. 7, 1992, Pat. No. 5,329,690, which is a continuation of Ser. No. 541,596, Jun. 21, 1990, abandoned.

[30] Foreign Application Priority Data

Jun. 22, 1989 [JP] Japan .................. 1-160291
Jan. 14, 1993 [JP] Japan .................. 5-5218

[51] Int. Cl.$^6$ .................. B23P 11/00; H05K 3/30
[52] U.S. Cl. .................. 29/430; 29/832
[58] Field of Search .................. 29/701–704, 711, 29/720, 721, 739, 742, 760, 793, 799, 783, 771, 784, 430, 832; 414/222, 273, 279; 364/468, 478; 198/347.1

[56] References Cited

U.S. PATENT DOCUMENTS

| | | | |
|---|---|---|---|
| 4,377,890 | 3/1983 | Miller | 29/430 X |
| 4,473,935 | 10/1984 | Tatsuura et al. | 29/429 |
| 4,703,558 | 11/1987 | Makinen | 29/784 |
| 4,719,694 | 1/1988 | Herberich et al. | 29/703 |
| 4,783,904 | 11/1988 | Kimura | 29/786 |
| 4,821,197 | 4/1989 | Kenik et al. | 364/468 |
| 4,872,257 | 10/1989 | Wakamori et al. | 29/701 |
| 4,884,330 | 12/1989 | Sticht | 29/710 X |
| 5,024,570 | 6/1991 | Kiriseko et al. | 414/222 |
| 5,231,585 | 7/1993 | Kobayashi et al. | 364/468 |
| 5,237,510 | 8/1993 | Kakizawa et al. | 198/347.1 |
| 5,283,943 | 2/1994 | Aguayo et al. | 29/720 X |

FOREIGN PATENT DOCUMENTS

| | | |
|---|---|---|
| 56-78387 | 6/1981 | Japan . |
| 60-56702 | 4/1985 | Japan . |
| 61-81690 | 4/1986 | Japan . |

*Primary Examiner*—S. Thomas Hughes
*Attorney, Agent, or Firm*—Kenyon & Kenyon

[57] ABSTRACT

A system for producing parts/substrate assemblies each of which includes a substrate such as a ceramic substrate and a plurality of parts such as LSIs mounted on the substrate. After the LSIs for one lot of the production have been checked for excess or deficiency, etc. by a collating device, they are formed with solder bumps and then inspected. The LSIs are automatically arranged on empty work pallets as parts kits by a kit setting apparatus, and the work pallets on each of which the corresponding LSIs have been arranged as the parts kit are moved into a stocker. A host computer gives a command for mounting the LSIs on the ceramic substrate on which they can be mounted, on the basis of information indicating the stocked pallet and information indicating the progress of the ceramic substrate. An LSI mounting apparatus reads the serial No. of the introduced ceramic substrate, and requests the stocker to deliver the work pallet on which the associated LSIs have been arranged as the parts kit.

5 Claims, 4 Drawing Sheets

FIG 3 A

DATA FROM HOST COMPUTER / DATA TO BE WRITTEN BY WORK STATION

| LOT NO. | LSI ARTICLE NAME | SUBSTRATE ARTICLE NAME | TABLE ADDRESS | IN-PALLET ADDRESS | PALLET NO. |
|---|---|---|---|---|---|
| 1 | LS001 | MOD005 | A0 | (1, 1) | · |
| 1 | · | · | A1 | (1, 2) | · |
| 1 | · | · | A2 | (1, 3) | · |
| 1 | · | · | · | · | · |
| · | · | · | · | · | · |

FIG 3 B

| LOT NO. | LSI ARTICLE NAME | SUBSTRATE ARTICLE NAME | TABLE ADDRESS | IN-PALLET ADDRESS | PALLET NO. |
|---|---|---|---|---|---|
| 1 | LS001 | MOD005 | A0 | (1, 1) | · |
| 2 | · | · | A1 (A0) | (1, 1) | · |
| 2 | · | · | A2 (A1) | (1, 2) | · |
| 2 | · | · | A3 (A2) | (1, 3) | · |
| · | · | · | · | · | · |

FIG 4 A
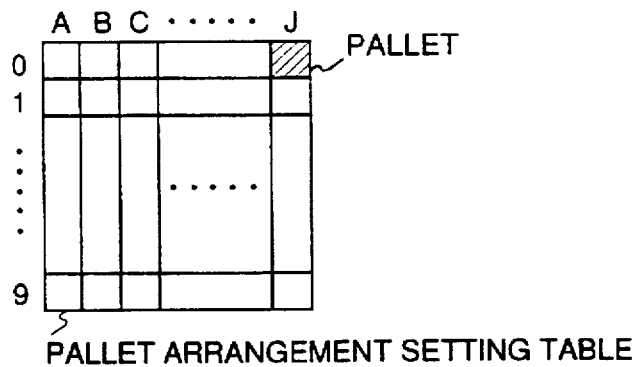
PALLET ARRANGEMENT SETTING TABLE
FIG 4 B
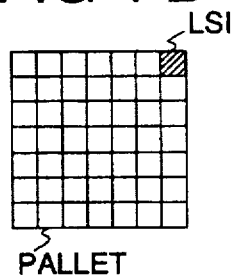
PALLET
FIG 5
| LSI ARTICLE NAME | TABLE ADDRESS | NUMBER OF MISSING PARTS | |
|---|---|---|---|
| L5J003-AB1 | A | 2 | HIGH ↑ PRIORITY LEVEL ↓ LOW |
| . | B | 4 | |
| . | B | 6 | |
| ⋮ | ⋮ | ⋮ | |

METHOD OF PRODUCING PARTS/ SUBSTRATE ASSEMBLIES

This is a division of application Ser. No. 08/181,142 filed 12 Jan. 1994, now U.S. Pat. No. 5,513,427, which is a Continuation-in-Part of application Ser. No. 07/987,085 filed 7 Dec. 1992, now U.S. Pat. No. 5,329,690 issued 19 Jul. 1994, which is a continuation of application Ser. No. 07/541,596 filed 21 Jun. 1990, abandoned.

BACKGROUND OF THE INVENTION

1. Field of the Invention

The present invention relates to a system for producing parts/substrate assemblies in each of which a plurality of kinds of parts or components are mounted on a substrate. More particularly, it relates to a parts/substrate assembly producing system well suited to mount electronic parts, such as LSIs, on substrates such as ceramic substrates and printed circuit boards for use in computers, etc.

2. Description of the Related Art

An assembly line for printed circuit boards for use in computers etc., has the feature that the printed circuit boards and electronic parts (for example, LSIs) are of various kinds. With note taken of this feature, the inventors consider it favorable to first put the electronic parts together as parts kits separately for the individual substrates on which the parts are to be mounted, and to supply each parts kit to an apparatus which mounts the parts of the kit on the associated substrate.

Such an expedient for supplying the parts is appropriate in a case where the parts are not prone to failure or damage in a production line. By way of example, it is difficult to cause lead pin type LSIs, the integration density of which is not very high, to become defective in the production line, so that the supplying expedient is applicable thereto.

Meanwhile, with further progress in the packaging technology of large-sized computers, printed circuit boards constituting electronic circuits have been shifting to ceramic substrates capable of higher-density packaging. Also for LSIs which are mounted on the ceramic substrate, a connection method based on solder bumps has consequently been replacing the conventional lead pin type in order to secure a larger number of connection points.

Therefore, a process for mounting electronic parts or components such as the LSIs on the ceramic substrate becomes very complicated. By way of example, at the step of fabricating for the LSI, solder balls serve to connect this LSI to the substrate, and solder balls in the number of 500–800 need to be regularly arranged on a chip of about 10 [mm-square] after the LSI received by a factory has been detached from a baby board. The execution of such micro-fabrication poses the problem that fabrication defects might arise in the LSI, so even when the LSIs for a lot of work are complete at the time of receipt, the shortage of the parts or LSIs might occur during the course of the process. On the other hand, it is sometimes impossible to receive the substrates and the LSIs within the predetermined time limit of delivery, for reasons such as difficulties with the technique of ceramic fabrication, etc.

As stated before, the substrate assembling technique requires as a prerequisite the conditions that the substrates and the LSIs which correspond to one lot of work for building one or more computers are complete at the time of starting the process, and that no damage to the LSIs takes place within the process.

In the case of applying the above method to a ceramic substrate assembling production system, therefore, it is apprehended that half-finished substrate assemblies will increase due to waiting for the supplement of the missing LSIs (ascribable to the defective LSIs), and that enormous amounts of manual labor will be necessitated for irregular disposals for coping with a lot which has undergone the shortage of the LSIs, resulting in the disorder of the process.

Besides, since the ceramic substrates and the LSIs are very expensive, reduction in the number of half-finished substrate assemblies and aid in the production system capable of delivering the products in a short time period become very important for curtailing a product cost.

Further, as stated before, the LSI needs to be formed with the solder balls on its surface after the introduction thereof into the production process. In this regard, there is the problem in the process that, when a certain time limit is exceeded from the formation of the solder balls till the mounting of the LSI and the reflow of the LSI bearing substrate, inferior soldering is incurred as a result of the oxidation of the soldering surface, etc. Therefore, how the synchronization between the ceramic substrate and the LSIs is achieved for the timely supply of the LSI parts becomes important for production control and quality control.

SUMMARY OF THE INVENTION

The present invention provides a parts/substrate assembly producing system and method in which, even when a fluctuation factor in production has occurred, a quantity of work is ensured while half-finished assemblies developing within an assembling process are minimized, and in which the supply of a ceramic substrate and parts are synchronized.

In order to accomplish the object, in one aspect of performance of the present invention, there is provided a system for producing parts/substrate assemblies in each of which predetermined kinds of parts in predetermined numbers are mounted on an associated one of substrates. The system comprises a plurality of work pallets which are prepared beforehand; a kit setting apparatus which selects the parts to be mounted on the associated substrate from among the parts externally supplied and then places the selected parts on at least one of the plurality of work pallets as is selected for each of the parts/substrate assemblies to be produced, thereby forming a parts kit; a parts mounting apparatus which mounts the parts placed on the work pallet, on the associated substrate; a stocker which is interposed between the kit setting apparatus and the parts mounting apparatus, and which temporarily stocks the work pallets carrying the parts thereon; and a reading unit which reads an identifier corresponding to a substrate name previously given to each of the substrates.

Here, the parts mounting apparatus includes management means for requesting the stocker to deliver the work pallet that corresponds to the substrate name indicated by the read identifier, thereby being supplied with the work pallet in real time.

The work pallets can have peculiar identifiers previously afforded thereto so as to be readable.

The kit setting apparatus can include a pallet arrangement setting table which has addresses previously determined for its subareas for arranging the respective pallets therein, and in which the respective pallets for placing the parts thereon are arranged in correspondence with the predetermined addresses; means for receiving kit arrangement setting data that are supplied from outside the system and that indicate the names of the respective substrates and names of the parts constituting the parts kits associated with the respective substrates, and for managing the kit arrangement setting data; means for reading the identifier afforded to the empty pallet that carries no parts thereon; pallet arrangement means for arranging the empty pallet at the predetermined address of the table; means for managing in corresponding relationship, information indicated by the read identifier of the empty pallet and the substrate name corresponding to the information; means for accepting the part supplied from outside the system, and for reading the name of the part; means for placing the part on the empty pallet that corresponds to the parts kit containing the part, by referring to the kit arrangement setting data on the basis of the read part name; and means for deriving the pallet that has completed the placement of the parts as the parts kit, and for transporting the pallet to the stocker.

The means for managing the kit arrangement setting data can hold in correspondence with each work lot of the production, data which bring into correspondence the substrate names of the types of substrates and numbers for the parts/substrate assemblies to be produced in the work lot and the part names of the type of parts and numbers therefor to be placed on the substrates.

The kit setting apparatus can further include means for creating and managing information items which indicate corresponding relations between the pallet and the part names of the parts placed on the pallet.

The kit setting apparatus can further include means for deciding, on the basis of the read part name, if the part is a superfluous part which is not used for any of the parts kits to be formed at a current time, among all the parts supplied from outside the system.

The decision means can define at least one of the pallets arranged in the pallet arrangement setting table, as a rejection pallet for placing the superfluous parts thereon.

The means for placing the part on the empty pallet can place the part on the rejection pallet when the part to be placed has been decided as the superfluous part by the decision means.

The means for managing the kit arrangement setting data can save the kit arrangement setting data concerning the pallet which has an incomplete parts kit because of deficiency in the parts to be placed, and it receives the kit arrangement setting data for forming the next parts kit, from outside the system and then manages the received data.

The kit setting apparatus can further include means for managing the names and numbers of missing parts of the parts kits in correspondence with the respective pallets, and for determining priority levels of the arrangement setting of the parts in an order of the pallets as to which the numbers of the missing parts are smaller.

Besides, in another aspect of performance of the present invention, there is provided a method of producing a plurality of sorts of parts/substrate assemblies, at least one assembly for each sort, each of which includes a substrate formed with a plurality of part mounting positions on a surface thereof, and a plurality of parts mounted at the parts mounting positions of the substrate, and wherein the substrates and the parts to be mounted thereon have different combinations in either of kinds and numbers thereof, comprising the steps of (a) accepting in any desired sequence, the parts of the types and the numbers which are required for constructing the parts/substrate assemblies of all the sorts and the total numbers to be produced; (b) successively arranging the accepted parts on pallets on which the parts are to be placed, among pallets which have been prepared beforehand in correspondence with the respective parts/substrate assemblies of all the sorts and the total numbers to be produced; (c) stocking the pallets each of which has completed the arrangement of the required parts by undergoing both the steps (a) and (b) at least once; (d) transporting the substrate which constitutes the combination, and the pallet on which the parts to be mounted on the substrate have been arranged, to a location at which the parts are mounted on the substrate, respectively, on condition that the substrate and the pallet have become complete; and (e) mounting the parts arranged on the transported pallet, on the transported substrate.

Now, the present invention will be viewed from the operations thereof. The parts/substrate assembling system of the present invention comprises a host computer which controls operations within a production process, and which supplies NC data corresponding to individual ceramic substrates, to NC apparatuses within the process in real-time on-line fashion; means for checking the receipt of the ceramic substrates and LSIs and other electronic parts for one lot, and for reporting the excess or deficiency of the substrates and the parts to the host computer; means for reporting to the host computer, defect information on the article names and the numbers of the LSIs having been damaged midway through the process; means for optimizing arrangement setting data on the basis of the defect information and receipt information on the LSIs at the introduction thereof; a kit setting apparatus by which the LSIs introduced for the lot are arranged on a work pallet as a parts kit on the basis of the arrangement setting data, the work pallet corresponding to one ceramic substrate; an LSI mounting apparatus by which the LSIs arranged as the parts kit are mounted on the associated ceramic substrate; and a pallet stocker which is interposed between the kit setting apparatus and the LSI mounting apparatus, and which functions to manage management Nos. affixed to the work pallets beforehand and information on the article names of the ceramic substrates corresponding to the pallets and to supply the work pallet in real time in compliance with a request made by the LSI mounting apparatus.

In addition, the kit setting apparatus includes a pallet arrangement setting area which can arrange therein the plurality of work pallets each serving to arrange the LSIs associated with one ceramic substrate, as the kit setting; a control unit which controls the whole apparatus; means for arranging the work pallets designated by the control unit, at the addresses of the pallet arrangement setting area as similarly designated; means for reading the individual Nos. affixed to the work pallets, and for managing addresses and the article names of the ceramic substrates with the read Nos. as keys; a mechanism which introduces the LSIs required for building one or more computers; a mechanism which derives the introduced LSIs one by one, and which reads the article name of the derived LSI and arranges the LSI at the address designated by the control unit; a mechanism which derives the work pallet having completed the kit setting, namely, the arrangement of the LSIs as the parts kit, and which conveys the work pallet to the pallet stocker; means for receiving the kit arrangement setting data from the host computer when a work lot No. is input thereto; and means for reediting data on the work lot of the input No. and data on half-finished work lots; the control unit controlling the mechanisms on the basis of the reedited data.

Even when the ceramic substrates for one lot are simultaneously introduced, the timings at which they arrive at the step of mounting disperse or may suffer a discrepancy due to various influences on the production process. When the LSIs are arranged with the dispersion of the arrival ignored, there arises a case where no substrate exists in spite of the end of the kit setting, and the reverse case, resulting in the increase of half-finished parts/substrate assemblies.

According to the present invention, therefore, the host computer which controls the process and which creates the NC data necessary for the individual steps of the process is furnished with means for estimating the timings at which the parts supplies will be needed, on the basis of progress information items which are based on the serial Nos. of the ceramic substrates, etc. as collected by progress report units installed for the respective steps, and time periods which are required for the respective steps; and means for establishing the priority levels of the order of performing the arrangement setting data, on the basis of the estimated information items. Thus, synchronization of the supplied parts with the progress of the ceramic substrates can be realized.

Further, in a case where the LSIs for one lot are not complete at the appointed date of delivery because of the various types thereof, so that the introduction of the LSIs is impossible, or in a case where the LSIs have been introduced with a parts shortage (the existence of missing parts) admitted, it is apprehended that the supply of the parts will fail to be synchronized with the progress of the ceramic substrates, so a production schedule will be disordered.

According to the present invention, therefore, the parts/substrate assembling system is furnished with means for detecting whether or not the ceramic substrates and the LSIs corresponding to the pertinent lot are complete in numbers, at the receipt thereof, and for reporting the excess or deficiency of the substrates and the LSIs to the host computer; means for reporting information on any damage having occurred midway during the production process, to the host computer in real time; and means for establishing the priority levels of the order of performing the arrangement setting data, on the basis of the damage information. Thus, even when the missing LSIs or the defective LSIs have developed at the time of introduction or during the course of the process, the production schedule can be smoothly dealt with, and the number of half-finished assemblies can be minimized.

Besides, in the case where the parts have been introduced in the state in which they are not complete for one lot, the number of work pallets which are half finished due to waiting for the missing parts can be suppressed to the minimum by the above means. However, the half-finished pallets corresponding to the pertinent lot remain in the pallet arrangement setting table.

According to the present invention, therefore, the assembling system is furnished with means for reporting information on the half-finished pallets left in a preceding lot, to the host computer; and means for creating the arrangement setting data of a succeeding lot on the basis of the reported information. Thus, even in the case where the half-finished pallets for the preceding lot remain in the arrangement setting area, the parts of the preceding lot are permitted to be introduced, and the stagnation and disorder of the production attributed to the missing or defective parts can be restrained to the utmost.

In addition, in a case where a superfluous part is coexistent among the parts introduced as one lot, the arrangement address of the superfluous LSI cannot be found in the arrangement setting data. It is therefore necessary to temporarily stop the assembling system and to take such disposal action as manually removing the LSI.

According to the present invention, therefore, the assembling system is furnished with means for recognizing any superfluous part through, e.g., the retrieval of the arrangement setting data; means for defining a partial domain in the arrangement setting area, as a pallet for superfluous parts (a rejection pallet for rejected parts); means for giving a command for arranging the superfluous part in the rejection pallet; means for detecting that the rejection pallet has become full of superfluous parts; means for discharging the filled rejection pallet; and means for supplying an empty pallet to the defined domain as a new rejection pallet. Thus, even when the superfluous part is coexistent among the parts introduced as one lot, the assembling system can be operated continuously without being stopped on each occasion.

Yet in addition, each electronic part such as LSI bears a manufactural lot No. along with the article name of the LSI indicating the function thereof. The ceramic substrate, however, is inevitably sealed with a cap after the mounting of the LSIs on account of the structure thereof. In performing the tracking management of the LSIs, accordingly, the lot No. of each LSI needs to be read in the LSI arranging operation and to be managed in combination with the serial No. of the associated ceramic substrate.

According to the present invention, therefore, the tracking management in the host computer is realized on the basis of means for reading the lot Nos. borne on the LSIs, in the LSI arranging operation; means for reporting the LSI lot Nos. to the host computer separately for the pallets having completed the kit setting, and with the pallet Nos. as keys; and means for reporting to the host computer, information on the correspondence between the serial No. of each ceramic substrate and the pallet No. of the pallet used for mounting the LSIs on the substrate.

BRIEF DESCRIPTION OF THE DRAWINGS

FIGS. 3A and 3B are explanatory diagrams each showing an example of arrangement setting data which correspond to lot numbers.

FIG. 4A is an explanatory diagram showing an example of a pallet arrangement setting table, while FIG. 4B is an explanatory diagram showing on an enlarged scale one square pallet which is located in the pallet arrangement setting table.

FIG. 5 is an explanatory diagram showing an example of a control which alters the priority levels of arrangement setting.

DETAILED DESCRIPTION

An embodiment of the present invention will be concretely described in conjunction with the accompanying drawings. A ceramic substrate and an LSI being a component or part for use in a large-sized computer have shapes as shown at numerals 16 and 14 in FIG. 1, respectively. One computer includes several tens of ceramic substrates and about one thousand LSIs. Regarding the types of LSIs, most of them are not used cyclically. Therefore, a method in which the LSIs in a number corresponding to the ceramic substrate are arranged or set on each pallet as a parts kit (the arrangement being termed "kit setting") in the mounting order thereof beforehand is especially effective as a method of supplying the LSIs to an LSI mounting apparatus (11 in FIG. 1) which mounts the LSIs on the substrate.

In addition, a time limit in a production process is involved from the end of the preprocessing of both the ceramic substrate and the LSIs till the mounting of the LSIs and the reflow of the LSI bearing substrate, because of such problems as the drying of a solder paste on the ceramic substrate and the oxidation of solder balls on the LSIs. Therefore, how the LSI parts are supplied in synchronism with the progress of the associated ceramic substrate becomes very important from the viewpoint of the reliability of the finished product.

Figure 1:
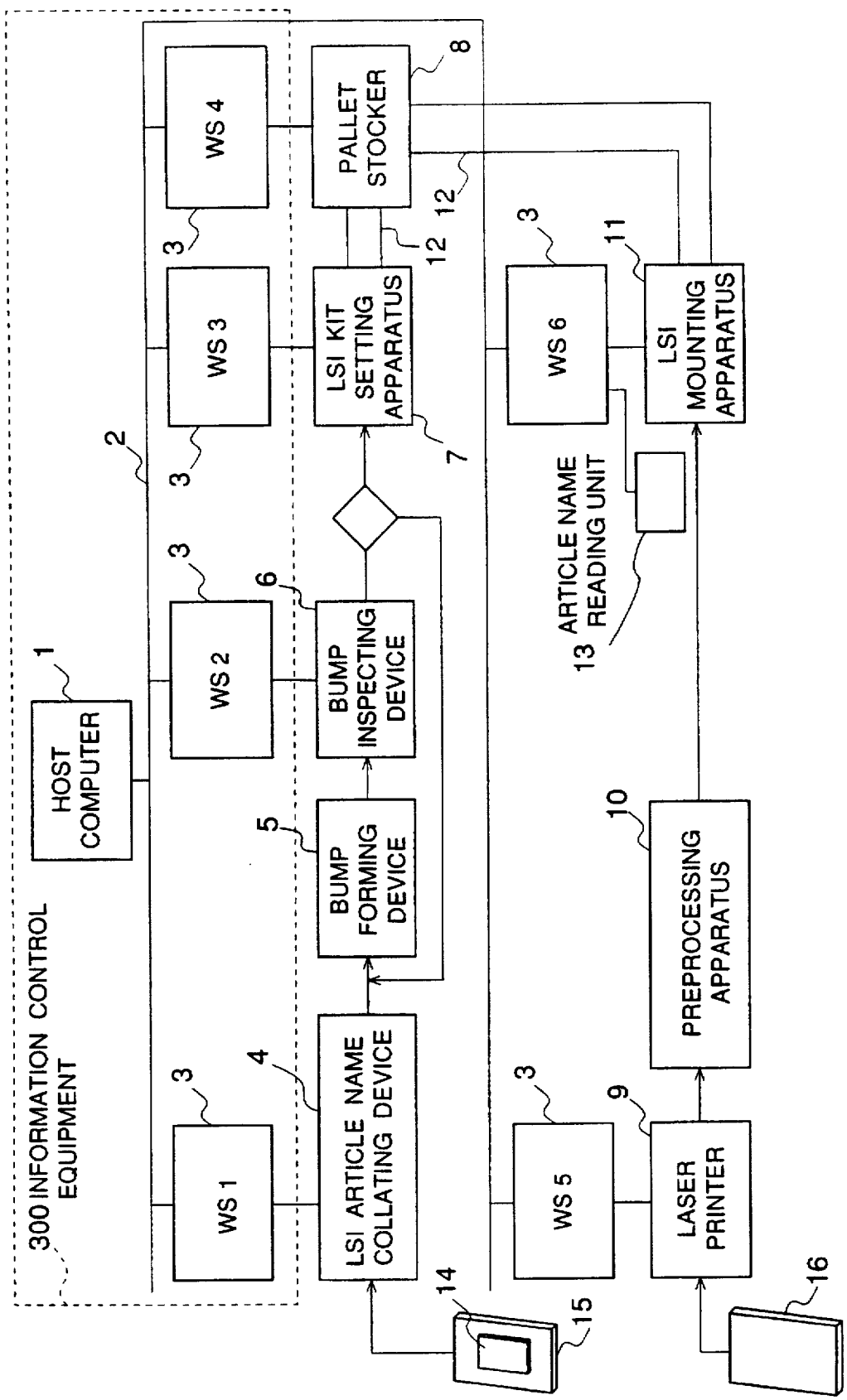
FIG. 1 is a block diagram showing the system architecture of one embodiment of the present invention.

FIG. 1 is a block diagram showing the system architecture of this embodiment. Referring to the figure, a host computer 1 is connected with other sections or departments by a network 2. Thus, the host computer 1 deals with, not only the exchange of data with the other sections, but also management operations concerning the whole process such as progress management and the creation and delivery of NC data. Besides, work stations 3 are interposed between the host computer 1 and individual production facilities. When requested by the production facilities, the work stations 3 execute the on-line transfer of the NC data and system controls corresponding to the facilities, concretely, automatic article-name reading, loader control, start/stop management, etc.

An information control equipment 300 is constructed by connecting the host computer 1 and the group of work stations 3 through the network 2. The information control equipment 300 thus constructed functions to collect in real time, individual status information such as information on the shortage (or missing parts) of the LSIs and the defects (or damage) thereof during the production process, information on the progress of the ceramic substrates, and information on half-finished substrate assemblies, and to feed them back to the process.

An LSI article name collating device 4 checks the excess or deficiency of the LSIs per introduced lot and the coexistence of superfluous parts in compliance with a command delivered from the information control equipment 300, at the introduction or input of the LSIs. A bump forming device 5 detaches the LSI 14 from a baby board 15, and then forms bumps in such a way that the solder balls for connecting the LSI 14 with the ceramic substrate are supplied to the connection surface of this LSI anew. A bump inspecting device 6 finds any damaged LSI, and reports the article name of the LSI to the host computer 1 through the work station 3 connected to this device 6.

When commanded by the information control equipment 300, an LSI kit setting apparatus 7 arranges or sets the LSIs as the parts kit on the work pallet corresponding to the ceramic substrate 16 on which the LSIs are to be mounted. A pallet stocker 8 temporarily stocks the work pallets having completed the kit setting, and it takes out the corresponding one of the work pallets in compliance with a request made by the LSI mounting apparatus 11.

A laser printer 9 prints on the ceramic substrate 16 a serial No. being the individual management No. thereof in compliance with a command given by the information control equipment 300. A preprocessing apparatus 10 washes the ceramic substrate 16 and coats it with the solder paste before the packaging of the LSIs. When commanded by the information control equipment 300, the LSI mounting apparatus 11 takes out of the pallet stocker 8 the work pallet which has completed the kit setting of the LSIs and which corresponds to the ceramic substrate 16, and it mounts the LSIs on the ceramic substrate 16. The above work pallet is transported by a conveyor 12. An article name reading unit 13 reads that serial No. of the ceramic substrate 16 which has been printed before.

The operations of the production process of this embodiment constructed as stated above will now be described. When the LSIs for one lot have been introduced in compliance with the command of the information control equipment 300, the article name collating device 4 checks the excess or deficiency of the LSIs constituting the lot (as to the names and numbers of the LSI articles) and the presence or absence of superfluous parts. Thereafter, the bump forming device 5 detaches each of the LSIs from the baby board 15, and it forms the bumps so that the solder balls are supplied to the connection surface of the LSI 14 anew in order to connect this LSI with the ceramic substrate 16. Since, at this processing step, 500~800 bumps are formed on the chip surface of 10 [mm-square], some of the LSIs might require reprocessing due to manufacturing defects or might become damaged during this step. The bump inspecting device 6 finds such defective LSIs, the article names of which are reported to the host computer 1 through the work station 3.

The LSIs formed with the bumps are randomly set in a work pallet capable of containing 42 LSIs therein, whereupon such work pallets are received in a magazine case capable of accommodating 10 work pallets therein. The encased LSIs are fed to the parts supply portion loader of the LSI kit setting apparatus 7. The number of LSIs for one lot is usually about one thousand though it differs depending upon the sorts of lots. Accordingly, the number of magazine cases to be fed in correspondence with one lot becomes 2~3. Moreover, from the nature of the bump forming step, it is impossible to process the introduced lot separately from any other lot. Accordingly, part of the different lot is fed to the LSI kit setting apparatus 7 in coexistence with the introduced lot.

In the LSI kit setting apparatus 7, a series of kit setting operations are started when the lot No. to be handled is input to the information control equipment 300. More specifically, in compliance with the command of the host computer 1, the empty work pallet for setting the LSIs thereon is supplied, and the LSIs are automatically set on the work pallet (the details of the LSI kit setting apparatus 7 will be explained later).

The pallet having completed the kit setting is moved to and taken into the pallet stocker 8 through a conveyor 12. On this occasion, a serial No. (hereinbelow, called "pallet No.") affixed in terms of a bar code label peculiarly to the work pallet is read by a bar code reader, not shown. The work station 3 (WS4) corresponding to the pallet stocker 8 executes stock management on the basis of the read No., a pallet No. sent from the LSI kit setting apparatus 7 through the network 2, and information on the lot No.—article name correspondence of the arranged ceramic substrate. The work station 3 sends information on the stock management to the host computer 1.

The host computer 1 issues a command for mounting the LSIs on the ceramic substrate on which these LSIs can be mounted, on the basis of information on agenda already scheduled, LSI stock information on the pallets each of which is kept in the pallet stocker 8 while carrying the parts kit, and the information on the progresses of the ceramic substrates.

The ceramic substrate 16 is first printed with the article name thereof and a serial No. peculiarly afforded thereto already in the manufacturing process thereof, by the laser printer 9 in compliance with the command of the host computer 1. Incidentally, the serial No. printed here is automatically read at an LSI mounting step, a repair wiring step, etc. and is used for progress/history management as well as the automation of data supply by the information control equipment 300.

In addition, the ceramic substrates shrink in their sintering operations, and the shrinking percentages thereof vary individually. Therefore, the magnitudes of shrinkage of the ceramic substrates are measured for the respective serial Nos., and design data are compensated. Thus, the information control equipment 300 is permitted to supply the appropriate NC data peculiar to the respective serial Nos., even for the ceramic substrates of identical article name.

The ceramic substrate 16 printed with the serial No. is subjected to the preprocessing for packaging the LSIs, concretely, the washing and the coating with the solder paste, whereupon it is supplied to the LSI mounting apparatus 11. Herein, the serial No. of the introduced ceramic substrate 16 is read by the article name reading unit 13. Thereafter, the work station 3 (WS6) corresponding to the LSI mounting apparatus 11 requests the host computer 1 through the network 2 to send the data in accordance with the read No., and it similarly requests the pallet stocker 8 to take out or deliver the work pallet on which the LSIs associated with the ceramic substrate 16 have been set as the parts kit.

In this manner, the illustrated embodiment realizes the synchronization between the supply of the ceramic substrates and the setting of the LSI parts.

Figure 2:
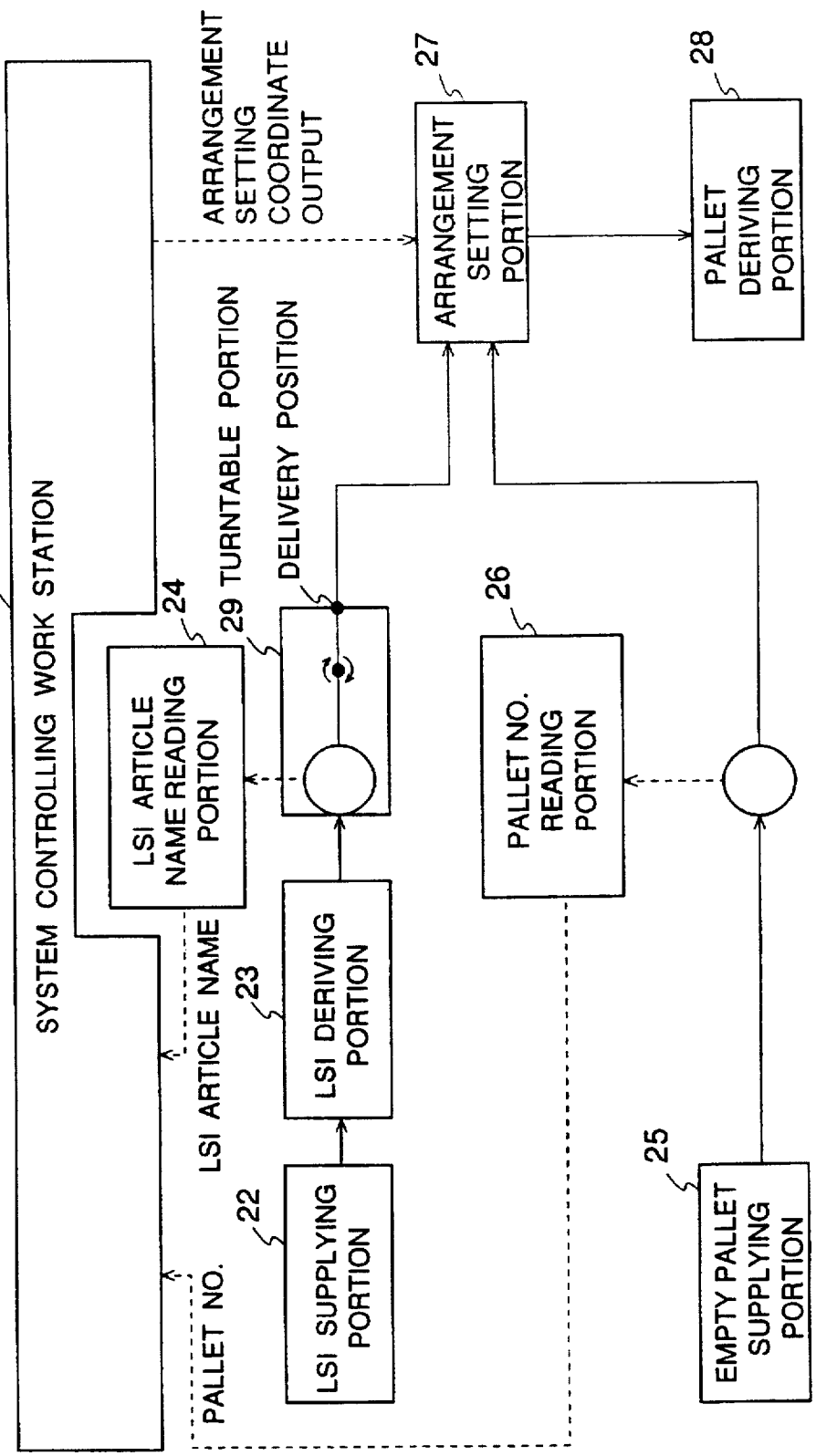
FIG. 2 is a block diagram showing an example of the construction of an LSI kit setting apparatus which is included in the embodiment of the present invention.

FIG. 2 is a block diagram showing the LSI kit setting apparatus 7 in this embodiment. Referring to the figure, the apparatus 7 includes a work station 21 which controls the whole system of this apparatus 7, an LSI supplying portion 22 which introduces the LSIs for the kit setting as accommodated in the magazine case, an LSI deriving portion 23 which successively derives the LSIs from the work pallet supplied by the LSI supplying portion 22 and which sets each of the derived LSIs on a turntable that is a position for reading the article name thereof, and an LSI article name reading portion 24 which reads the article name of the LSI in compliance with a command given by the work station 21 and which reports the read information to the work station 21.

Also included are an empty pallet supplying portion 25 and a pallet No. reading portion 26. Numeral 29 indicates a turntable portion by which the LSI is moved from the article name reading portion (the aforementioned turntable) to a delivery position for delivering the LSI to an arrangement setting portion 27. This arrangement setting portion 27 is configured of a robot which arranges empty pallets for the kit setting, arranges or sets the LSIs on the pallets as the parts kits and delivers the pallets having completed the kit setting, in compliance with the command of the work station 21, and a pallet arrangement setting table on which one hundred pallets can be arranged. Shown at numeral 28 is a pallet deriving portion from which the pallets delivered by the arrangement setting portion 27 are derived.

FIG. 4A is a diagram showing the pallet arrangement setting table for the 10×10 pallets, while FIG. 4B is a diagram showing one pallet on an enlarged scale.

The operation of the LSI kit setting apparatus 7 will be explained. When the No. of a work lot to be handled is input to the work station 21, this work station 21 receives arrangement setting data corresponding to the lot No. as shown in FIG. 3A or 3B, from the host computer 1.

The arrangement setting data corresponding to lot Nos. as shown in FIG. 3A or 3B are composed of an LSI article name, a substrate article name, an address within the pallet arrangement setting table and an address within the pallet, which are the data to be received from the host computer 1, and a pallet No. which is data to be written by the work station 21. The arrangement setting data shown in FIG. 3A correspond to lot #1.

Regarding the arrangement setting data, in a case where the work pallet of a preceding work lot (for example, the work lot of lot #1) remains half finished for such a reason as waiting for a missing LSI, it is disposed of as follows: It is assumed by way of example that the LSI in the work pallet whose table address is coordinates A0 (refer also to FIG. 4A) as indicated in FIG. 3A is missing, so this work pallet becomes half finished. Herein, the half-finished work pallet remains at the coordinates A0 though the other pallets having no missing parts (at coordinates A1, A2, ... in FIG. 3A) enter the pallet stocker 8 as stated before. Then, the arrangement setting data change, as indicated in FIG. 3B, so that only the data concerning the half-finished pallet of the lot #1 at the coordinates A0 are left, whereas the data concerning the other finished pallets of the lot #1 at the coordinates A1, A2, ... are erased. In this state, the work station 21 of the LSI kit setting apparatus 7 receives the arrangement setting data (at coordinates A0, A1, A2, ... parenthesized in FIG. 3B) of a succeeding work lot (lot #2) from the host computer 1, and it writes the pallet data successively from an address position next to the address position A0 of the half-finished pallet of the lot #1 (in correspondence with the coordinates A1, A2, A3, ... indicated in FIG. 3B). That is, the work station 21 relocates the pallet addresses of the host data into free addresses.

Subsequently, a start key is depressed on the keyboard of the work station 21. Then, the work station 21 extracts the table address at which the work pallet is to be arranged, with reference to the arrangement setting data, and it commands the arrangement setting portion 27 to arrange the empty pallet at the address. At the command, the arrangement setting portion 27 takes the empty pallet out of the empty pallet supplying portion 25 and sets it at the commanded location.

On this occasion, the pallet No. reading portion 26 reads the pallet No. affixed to the pallet beforehand and indicated by the bar code label, and it reports the read No. to the work station 21. The work station 21 writes the received pallet No. into the record of the arrangement setting data as indicated in FIGS. 3A or 3B.

When a required number of pallets have been arranged, one further pallet is lastly arranged at a table address which is designated for the pallet for rejected LSIs. Thereafter, the step of arranging the pallets is shifted to the step of arranging the LSIs as the parts kits.

When commanded by the work station 21, the LSI supplying portion 22 and the LSI deriving portion 23 operate to derive the LSI and to set it at the article name reading position. The LSI article name reading portion 324 reads the article name of the set LSI, and reports the read name to the work station 21. Then, the work station 21 commands the turntable portion 29 to turn. Thereafter, the work station 21 seeks the arrangement setting address corresponding to the LSI from among the arrangement setting data and on the basis of the article name information, and it delivers an arrangement setting coordinate output to the robot of the arrangement setting portion 27. The robot having received the coordinate output performs the arrangement of the LSI.

As shown in FIGS. 3A and 3B, the arrangement setting data are so organized that the table coordinates of the pallets corresponding to the ceramic substrates on which the LSIs are to be mounted, and the coordinates of the LSIs within the pallets are indicated in correspondence with the article names of the respective LSIs. The in-pallet coordinates are given in the mounting sequence of the LSIs, so that the LSI mounting apparatus 11 can mount the LSIs without reading the article names thereof. Besides, in point of mechanism, the LSI kit setting apparatus 7 is furnished with the turntable portion 29. Therefore, the step of arranging the LSIs as the parts kit can be executed in parallel with the operations of reading the article names of the second LSI, et seq.

By the way, the arrangement setting portion 27 manages the article names and the number of the LSIs lacking or missing at the LSI arranging step, for each of the pallets, and it performs a control for altering the priority levels of the LSI arrangement in the order of decreasing number of lacking LSIs. FIG. 5 illustrates an example of the control for altering the priority levels of the LSI arrangement.

As stated before, in the preprocessing of the LSIs, it is, in effect, impossible to supply the LSIs of the pertinent introduced lot without the coexistence of any other lot. Granted that the supply of only the introduced lot is possible, it will require enormous amounts of manual labor and a very large number of man-hours for management. This embodiment therefore copes with the situation in such a way that, even in the coexistence of the LSI which belongs to the lot other than the pertinent lot, namely, the LSI the arrangement setting coordinates of which cannot be found among the arrangement setting data, it is arranged in the pallet which is defined as the pallet for rejected LSIs (also termed the "rejection pallet").

Incidentally, the rejection pallet can accommodate 42 LSIs like each of the other pallets. When the rejection pallet has become full of rejected LSIs, the work station 21 operates to temporarily interrupt the LSI arrangement, to discharge the rejection pallet and to supply an empty pallet anew. Subsequently, the operation of arranging the LSIs is restarted. Thus, in this embodiment, the arrangement of the LSIs proceeds without manual intervention. As stated above, part of the pallet arrangement setting table is defined as the rejection pallet, in which the superfluous parts are arranged. It is therefore possible to realize the LSI arranging operation without providing any special mechanism and in a continuous fashion.

Besides, the pallet for introducing the LSIs is identical in shape to the pallet for arranging the LSIs as the parts kit. Therefore, the pallet filled up with the rejected LSIs and then discharged can be directly supplied from the LSI introducing loader portion when the next lot is handled.

At the LSI arranging step, the timings at which the kit setting is completed differ depending upon the individual pallets. In order to realize real-time production suppressive of half-finished pallets, accordingly, the finished pallets each bearing the parts kit need to be successively derived and sent to the LSI mounting apparatus 11.

However, when a pallet deriving operation is performed each time one pallet is finished, a loss time arises. In this embodiment, therefore, the work station 21 of the LSI kit setting apparatus 7 reports the completion of the kit setting of the LSIs associated with the ceramic substrate, to the host computer 1 of the information control equipment 300 each time one pallet has been finished. Then, the host computer 1 transfers information which indicates whether or not the operation is an express disposal. Only in the case of the express disposal, the pallet deriving operation performed each one pallet time is finished. In the other case, when the pallets for one lot work have been finished, they are derived. Alternatively, the LSI arranging operation is stopped half-way by depressing the stop key of the keyboard of the work station 21, and the pallets having completed the kit setting at that time are derived by depressing the finished-pallet discharge key thereof.

To this end, the illustrated embodiment is provided with the pallet stocker 8 functioning as a buffer, between the LSI kit setting apparatus 7 and the LSI mounting apparatus 11, thereby realizing the real-time supply of the LSIs to the LSI mounting apparatus 11.

The pallet stocker 8 is furnished with a bar code reader at the inlet or take-in port thereof. Thus, the contents of the bar code label of the pallet derived from the LSI kit setting apparatus 7 are read by the bar code reader. Thereafter, the pallet is stored in an empty one of the shelves of the pallet stocker 8. The work station 3 (WS4) for controlling the pallet stocker 8 obtains the work lot No. of the pallet and the article names of the ceramic substrates corresponding to the lot No., through the network 2 by referring to the arrangement setting data on the basis of the pallet No. given as a bar code input to this work station. Herein, the work station 3 writes the above information items and the storage addresses of the ceramic substrates into a stock table, along with the pallet No. Further, the work station 3 sends the contents of the stock table to the host computer 1. Simultaneously, it displays on its display unit the article names of the ceramic substrates on which the LSIs can be mounted, and the work lot No. of the mounting operations.

As regards the LSI mounting apparatus 11, the work station 3 (WS6) corresponding thereto reads the serial No. printed on the introduced ceramic substrate, through the article name reading unit 13. Subsequently, it requests the host computer 1 to transfer the NC data and also requests the pallet stocker 8 to deliver or take out the pallet on which the LSIs have been arranged or set as the parts kit. Herein, the delivery request toward the pallet stocker 8 is made using the information of the work lot No.—the ceramic-substrate article name, and this information is obtained by reporting the serial No. to the host computer 1.

By the way, the cap surface of each LSI bears the manufacturing lot No. of the LSI along with the article name thereof indicating the function thereof. The ceramic substrate, however, is inevitably sealed with a cap after the mounting of the LSIs on account of the structure thereof. In performing the tracking management of the LSIs, accordingly, the lot No. of each LSI needs to be read in the LSI arranging operation and to be managed in combination with the serial No. of the associated ceramic substrate.

More specifically, the lot Nos. borne on the LSIs are read in the LSI arranging operation. The LSI lot Nos. are reported to the host computer 1 separately for the pallets having completed the kit setting, and with the pallet Nos. as keys. Also, information on the correspondence between the serial No. of each ceramic substrate and the pallet No. of the pallet used for mounting the LSIs on the substrate is reported to the host computer 1. The host computer 1 can perform the tracking management on the basis of the reported information items, that is, it can manage the LSI lot No. information for the respective ceramic substrates.

As described above, according to this embodiment, work pallets are supplied from a stocker in real time in compliance with a request from an LSI mounting apparatus.

Therefore, even when any fluctuating factor of production attributed to available percentage etc. has developed, the production can be carried out in a short time and at a high precision while minimizing half-finished products within a production process. Also, the synchronization among a plurality of different steps can be exactly controlled. Further, LSIs can be supplied to the LSI mounting apparatus with the minimum space and in real time.

Even when superfluous parts exist among parts of introduced lot, a rejection pallet for arranging the superfluous parts therein is prepared, and hence, the production system of this embodiment can perform operations continuously without being stopped.

Even in a case where half-finished pallets in a preceding lot remain in an arrangement setting area, the parts of a succeeding lot can be introduced, so that the stagnation of the production attributed to parts shortage can be suppressed to the utmost.

Since priority levels are established for the arrangement setting order of arrangement setting data, half-finished products can be minimized even when LSIs are defective at the introduction of a lot or they become damaged midway during the production process.

Tracking management for the lot Nos. of LSIs packaged and the Nos. of corresponding pallets can be performed for respective ceramic substrates managed on the basis of serial Nos. Therefore, even in a case where the lot defects of the LSIs have developed, a countermeasure such as the replacement of the LSIs can be taken quickly.

What is claimed is:

1. A method of producing a plurality of kinds of parts/substrate assemblies each of said parts/substrate assemblies comprising a predetermined kind and number of parts, and a substrate on which said parts are to be mounted, each of said parts/substrate assemblies being produced by mounting said parts on corresponding substrates, and said parts/substrate assemblies differing in kinds or numbers of parts to be mounted, wherein said plurality of kinds of parts/substrate assemblies are produced in a same production process, where plural kinds of parts are mixed and matched with plural kinds of substrate assemblies, said method comprising the steps of:

(a) accepting parts necessary for assembling a plurality of kinds of parts/substrate assemblies to be produced;

(b) providing at least one pallet corresponding to each of said plurality of kinds of parts/substrate assemblies;

(c) selectively distributing said accepted parts to the pallets thus provided, in accordance with predetermined requirements for each of said parts/substrate assemblies;

(d) stocking the pallets to which the parts are distributed;

(e) taking out a respective one of said stocked pallets with its respective parts to be used for assembling a corresponding one of said parts/substrate assemblies and transporting the respective pallet to a place where the respective parts are to be mounted on the corresponding substrate; and (f) removing the respective parts from the transported pallet and mounting the respective parts on the corresponding substrate.

2. A method of producing parts/substrate assemblies according to claim 1, wherein said step (d) comprises the steps of:

for each respective one of the pallets, determining whether or not said pallet has on it respective parts of the kinds and numbers required for its corresponding parts/substrate assembly and stocking the pallet only when it has all the necessary kind and number of parts.

3. A method of producing parts/substrate assemblies according to claim 2, wherein said step (d) further comprises the step of:

repeating said steps (a) and (c) for a pallet which lacks any respective parts necessary for its corresponding parts/substrate assembly.

4. The method of producing parts/substrate assemblies according to claim 1, wherein said step (a) comprises the steps of:

identifying names of the respective parts upon accepting the parts, and checking whether or not there is any lack in a required number of respective parts for each of the plurality of kinds of parts/substrate assemblies to be produced, and recording the result of the checking; and wherein said step (c) comprises the steps of:

setting a priority level among said plurality of kinds of parts/substrate assemblies to be produced based on a number of parts lacking on respective pallets in a manner that respective ones of the plurality of kinds of parts/substrate assemblies having a smaller number of lacking parts are given a higher priority level, and distributing the parts to the respective pallets beginning with the pallet corresponding to the respective parts/substrate assembly having a highest priority level.

5. A method of producing parts/substrate assemblies according to claim 1, further comprising the step of:

(g) removing a corresponding substrate and identifying the substrate before performing step (e), said step (e), being carried out in such a manner that the respective one of said pallets which corresponds to the substrate thus identified and on which respective parts for the parts/substrate assembly to be produced have been distributed is removed.

* * * * *

UNITED STATES PATENT AND TRADEMARK OFFICE
CERTIFICATE OF CORRECTION

PATENT NO. : 5,745,972
DATED : 5 May 1998
INVENTOR(S) : Tetsuhiro YOKOYAMA et al.

It is certified that error appears in the above-identified patent and that said Letters Patent is hereby corrected as shown below:

In the Title Page: Change "YOKAYAMA" (both occurrences) to --YOKOYAMA--.

| Column | Line | |
|---|---|---|
| 1 | 23 | After "computers" insert --,--. |
| 1 | 66 | Delete "p". |
| 1 | 67 | Change "lace" to --place--. |

Signed and Sealed this

Ninth Day of March, 1999

Attest:

Attesting Officer

Q. TODD DICKINSON

Acting Commissioner of Patents and Trademarks